(12) United States Patent
Takakusaki et al.

(10) Patent No.: US 8,203,848 B2
(45) Date of Patent: Jun. 19, 2012

(54) CIRCUIT DEVICE AND METHOD OF MANUFACTURING THE SAME

(75) Inventors: Sadamichi Takakusaki, Ota (JP); Noriaki Sakamoto, Midori (JP)

(73) Assignee: SANYO Electric Co., Ltd., Moriguchi (JP)

(*) Notice: Subject to any disclaimer, the term of this patent is extended or adjusted under 35 U.S.C. 154(b) by 1118 days.

(21) Appl. No.: 12/065,001

(22) PCT Filed: Aug. 30, 2006

(86) PCT No.: PCT/JP2006/317604
§ 371 (c)(1),
(2), (4) Date: Feb. 27, 2008

(87) PCT Pub. No.: WO2007/026944
PCT Pub. Date: Mar. 8, 2007

(65) Prior Publication Data
US 2009/0129038 A1 May 21, 2009

(30) Foreign Application Priority Data
Aug. 31, 2005 (JP) .................................. 2005-252188

(51) Int. Cl.
*H01R 9/00* (2006.01)
(52) U.S. Cl. ......................... 361/772; 257/696; 257/723
(58) Field of Classification Search .................... None
See application file for complete search history.

(56) References Cited

U.S. PATENT DOCUMENTS

| 5,559,374 | A | * | 9/1996 | Ohta et al. | 257/723 |
| 6,313,520 | B1 | * | 11/2001 | Yoshida et al. | 257/676 |
| 7,061,080 | B2 | * | 6/2006 | Jeun et al. | 257/676 |
| 7,157,292 | B2 | | 1/2007 | Huang | |
| 7,208,819 | B2 | * | 4/2007 | Jeun et al. | 257/666 |
| 7,256,489 | B2 | * | 8/2007 | Ishikawa et al. | 257/696 |
| 7,957,158 | B2 | * | 6/2011 | Takakusaki et al. | 361/808 |
| 2006/0056213 | A1 | * | 3/2006 | Lee et al. | 363/144 |

FOREIGN PATENT DOCUMENTS

| JP | 05-102645 | 4/1993 |
| JP | 07-226481 | 8/1995 |
| JP | 11-233712 | 8/1999 |
| JP | 2003-124400 | 4/2003 |
| TW | 1237372 | 8/2005 |

OTHER PUBLICATIONS

Taiwanese Office Action dated Jul. 30, 2009 (2 pages).

* cited by examiner

*Primary Examiner* — Gregory Thompson
(74) *Attorney, Agent, or Firm* — Westerman, Hattori, Daniels & Adrian, LLP

(57) ABSTRACT

Provided is a simplified structure of a circuit device in which a power element generating a large amount of heat is incorporated. The circuit device according to the present invention includes: a circuit board whose surface is covered with an insulating layer; a conductive pattern formed on the surface of the insulating layer; a circuit element electrically connected to the conductive pattern; and a lead connected to a pad formed of the conductive pattern. Furthermore, a power element is fixed to the top surface of a land portion formed of a part of the lead. Accordingly, the land portion serves as a heat sink, thereby contributing to heat dissipation.

8 Claims, 9 Drawing Sheets

FIG2.A
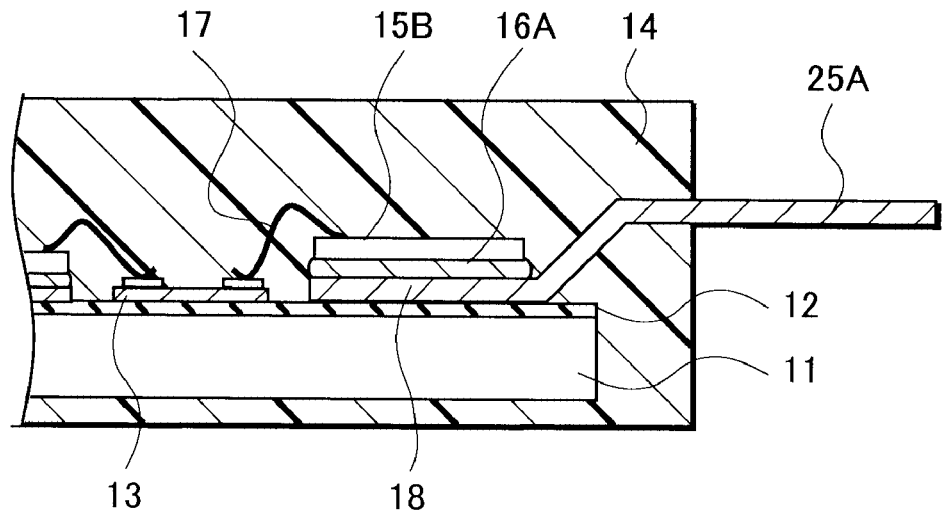
FIG2.B
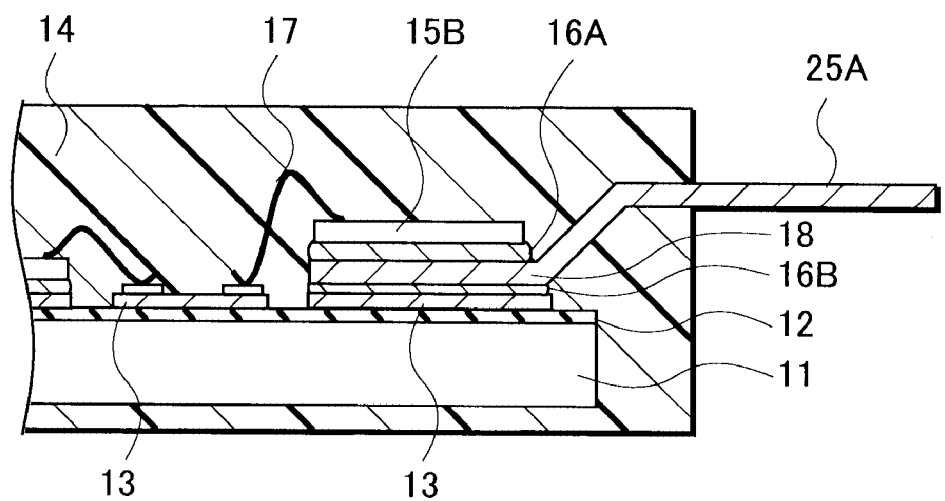

CIRCUIT DEVICE AND METHOD OF MANUFACTURING THE SAME

BACKGROUND OF THE INVENTION

This application claims priority from Japanese Patent Application Number JP 2005-252188 filed on Aug. 31, 2005, the content of which is incorporated herein by reference in its entirety.

FIELD OF THE INVENTION

The present invention relates to a circuit device and a method of fabricating the same. The present invention particularly relates to: a circuit device in which a power semiconductor element is mounted on a surface of a circuit board; and a method of fabricating the circuit device.

DESCRIPTION OF THE RELATED ART

Description will be given of a configuration of a conventional hybrid integrated circuit device 100 with reference to FIG. 9. This technology is described, for instance, in Japanese Patent Application Publication No. Hei 5 (1993)-102645. A conductive pattern 103 is formed on a surface of a rectangular board 101 with an insulating layer 102 interposed therebetween. A circuit element is fixed to a desired position of the conductive pattern 103 thereby to form a predetermined electronic circuit. Here, a semiconductor element 105A and a chip element 105B serving as the circuit elements are connected to the conductive pattern 103. A lead 104 is connected to a pad 109 which is a part of the conductive pattern 103, and which is formed on the periphery of the board 101, and the lead 104 serves as an external terminal. A sealing resin 108 functions to seal the electronic circuit formed on the surface of the board 101.

The semiconductor element 105A is a power element through which a large amount of current such as 1 A or more flows, and a very large amount of heat is generated therefrom. For this reason, the semiconductor element 105A has been mounted on the top of a heat sink 110 mounted on the conductive pattern 103. The heat sink 110 is made of a metal piece such as copper, and for example, approximately has a length of 10 mm, a width of 10 mm, and a thickness of 1 mm. By adopting the heat sink 110, it is possible to actively dissipate heat generated from the semiconductor element 105A to the outside.

Nevertheless, if the heat sink 110 is adopted, the entire configuration of the above-described hybrid integrated circuit device 100 becomes complex, and as a result, the production cost is increased.

Furthermore, when the semiconductor element 105A through which a large amount of current flows is disposed on the conductive pattern 103, the conductive pattern 103 to be formed on the circuit board 101 needs to be wide enough for such a current to be supplied to the semiconductor element 105A. Specifically, since the conductive pattern 103 is formed as thin as, for example, approximately 50 μm, the width of the conductive pattern 103 needs to be as large as approximately several mm in order to increase the current capacity thereof. This causes a problem that the scale of the entire device is enlarged.

Moreover, in fabricating the circuit device, since the heat sink 110 needs to be formed and disposed on the circuit board 101, and thereby the number of fabrication steps is increased, there is a problem that the production cost is increased.

SUMMARY OF THE INVENTION

The present invention has been made in view of the problems described above. A main object of the present invention is to provide: a circuit device which has a simplified structure with a power semiconductor element incorporated; and a method of fabricating the circuit device.

A circuit device according to the present invention is characterized as follows. Specifically, the circuit device includes: a circuit board; a conductive pattern, which is formed on the top surface of the circuit board; a circuit element, which is electrically connected to the conductive pattern; and a lead, which is electrically connected to the circuit element, and which is led out to the outside. The circuit element is mounted on the top surface of a land portion formed of a part of the lead. The bottom surface of the land portion is fixed to the circuit board.

A method of fabricating a circuit device according to the present invention is characterized as follows. Specifically, the method includes the steps of: forming a conductive pattern on the top surface of an insulating layer formed to cover a circuit board; electrically connecting a circuit element to the conductive pattern; and fixing a lead to the surface of the circuit board. The circuit element is fixed to a land portion formed of a part of the lead.

Furthermore, another method of fabricating a circuit device is characterized by including the steps of: attaching a conductive foil to the top surface of a circuit board with an insulating layer in a B stage interposed therebetween; forming a conductive pattern by patterning the conductive foil; fixing a circuit element to a land portion formed of a part of a lead; and attaching the bottom surface of the land portion in the lead to the surface of the insulating layer.

BRIEF DESCRIPTION OF THE DRAWINGS

FIG. 2A is a cross-sectional view of the circuit device according to the present invention;

FIG. 2B is a cross-sectional view of the circuit device according to the present invention;

DETAILED DESCRIPTION OF THE PREFERRED EMBODIMENTS

First Embodiment

In this embodiment, with reference to FIGS. 1A to 3B, description will be given of a structure of a hybrid integrated circuit device 10 as an example of a circuit device.

Figure 1A:
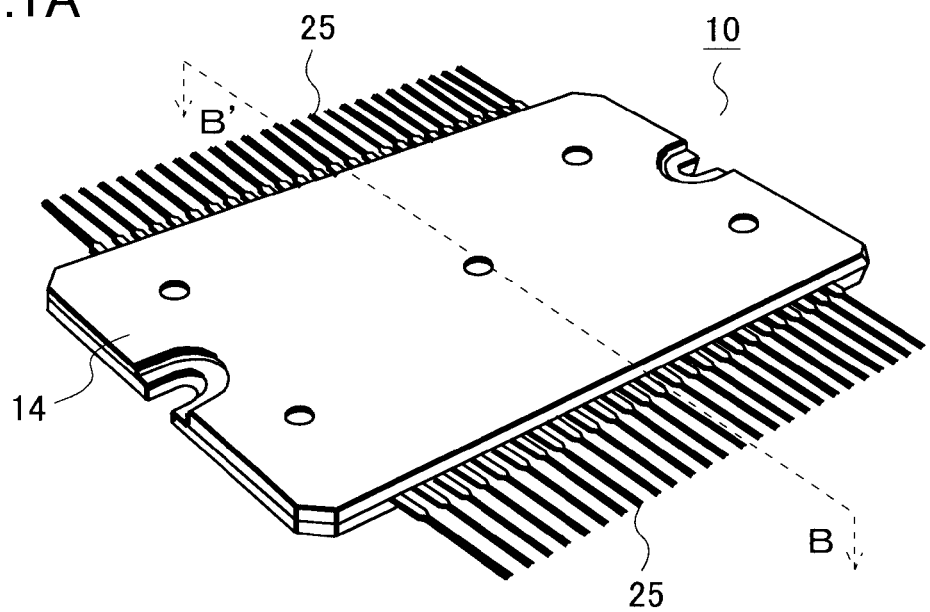
FIG. 1A is a perspective view of a circuit device according to the present invention.
Figure 1B:
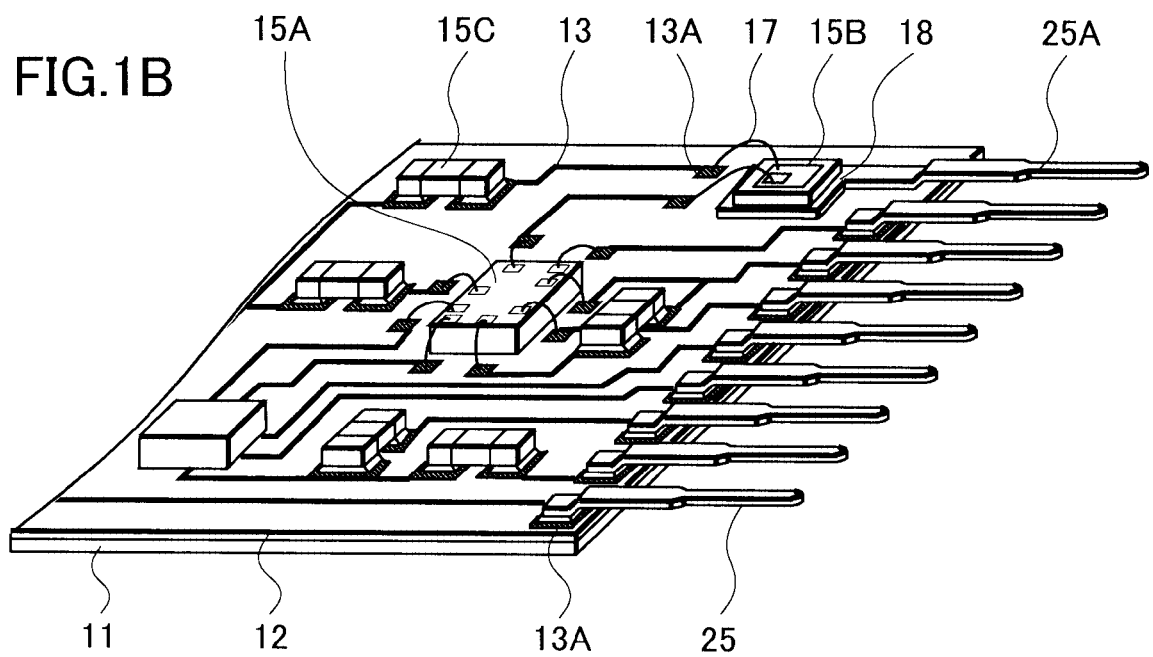
FIG. 1B is a perspective view of the circuit device according to the present invention.

With reference to FIGS. 1A and 1B, description will be given of a configuration of the hybrid integrated circuit device 10 in this embodiment. FIG. 1A is a perspective view of the hybrid integrated circuit device 10 as seen diagonally from above. FIG. 1B is a perspective view of the hybrid integrated circuit device 10, while omitting a sealing resin 14 which seals the entire device.

As shown in FIGS. 1A and 1B, an insulating layer 12 is formed on a surface of a rectangular circuit board 11. Circuit elements such as a control element 15A and a chip element 15C, which form LSI, are electrically connected to predetermined positions of a conductive pattern 13 formed on the surface of the insulating layer 12. The sealing resin 14 seals the circuit elements and the conductive pattern 13 formed on the surface of the insulating layer 12. Leads 25 are led out from the sealing resin 14 to the outside.

The circuit board 11 is a metal board having a metal such as aluminium (Al) and copper (Cu) as the main material. The specific size of the circuit board 11 is, for example, approximately 30 mm in length, 15 mm in width, and 1.5 mm in thickness. When an aluminium board is adopted as the circuit board 11, both of the main surfaces of the circuit board 11 are anodized.

The insulating layer 12 is formed to cover the entire top surface of the circuit board 11. The insulating layer 12 is made of, for example, an epoxy resin in which a filler such as $Al_2O_3$ is filled to a high degree. This makes it possible to actively dissipate heat generated from the circuit element incorporated in the device to the outside, through the circuit board 11. The specific thickness of the insulating layer 12 is, for example, approximately 50 µm. Meanwhile, the back surface of the circuit board 11 may be covered with the insulating layer 12. Thereby, even when the back surface of the circuit board 11 is exposed to the outside from the sealing resin 14, the back surface of the circuit board 11 can be insulated from the outside.

The conductive pattern 13 is made of a metal such as copper, and is formed on the surface of the insulating layer 12 to form a predetermined electronic circuit. Pads 13A formed of the conductive pattern 13 are formed on the side where the leads 25 are led out. Furthermore, a number of the pads 13A are formed around the control element 15A. The pads 13A and the control element 15A are connected to each other with thin metal wires 17. Although the single-layered conductive pattern 13 is illustrated in FIG. 1B, on the top surface of the circuit board 11, there maybe formed the multiple-layered conductive pattern 13 laminated with the insulating layer 12 interposed therebetween.

The conductive pattern 13 is formed by patterning a thin conductive film which has a thickness of approximately 50 µm to 100 µm, and which is formed on the surface of the insulating layer 12. Accordingly, the conductive pattern 13 can be formed as narrow as approximately 50 µm to 100 µm. In addition, a separation distance between the lines of the conductive pattern 13 can be made short approximately 50 µm to 100 µm. Thus, even when the control element 15A has several hundred electrodes, the pads 13A, the number of which corresponds to the number of the electrodes, can be formed around the control element 15A. Moreover, an electronic circuit, being complex due to the finely-formed conductive pattern 13, can be formed on the surface of the circuit board 11.

As the circuit element electrically connected to the conductive pattern 13, an active element and a passive element can be adopted in general. Specifically, it is possible to adopt the circuit elements such as a transistor, an LSI chip, a diode, a chip resistance, a chip capacitor, an inductance, a thermistor, an antenna, an oscillator, and the like. Furthermore, as the circuit element, a package of a resin-sealing type, and the like, can be fixed to the conductive pattern 13.

As shown in FIG. 1B, as the circuit element, the control element 15A, a power element 15B, and the chip element 15C are disposed on the top surface of the circuit board 11. The control element 15A is an LSI in which a predetermined electronic circuit is formed on the surface, and supplies an electronic signal to a control electrode of the power element 15B. Meanwhile, a current of, for example, 1 A or more flows through the main electrode of the power element 15B, and the operation thereof is controlled by the control element 15A. Specifically, a MOSFET (metal-oxide semiconductor field effect transistor), an IGBT (insulated gate bipolar transistor), an IC (integrated circuit), a bipolar transistor, and the like, can be adopted as the power element 15B. In FIG. 1B, the power element 15B is mounted on the top surface of a land portion 18 that is a part of a lead 25A. The specific description thereof will be given later.

The sealing resin 14 is formed by transfer molding with a thermosetting resin or by injection molding with a thermoplastic resin. In FIG. 1A, the sealing resin 14 seals the conductive pattern 13, the circuit element, the power element 15B and the thin metal wire 17. Alternatively, the sealing resin 14 may cover the entire circuit board 11 including the back surface thereof, or the back surface of the circuit board 11 may be exposed from the sealing resin 14.

One end of the lead 25 is electrically connected to the pad 13A on the circuit board 11, and the other end of the lead 25 is led out from the sealing resin 14 to the outside. The lead 25 is made of a metal such as copper (Cu), aluminium (Al) or a Fe—Ni alloy as the main component. Here, the leads 25 are connected to the pads 13A formed along two opposing sides of the circuit board 11. Nonetheless, the leads 25 may be connected to the pads 13A formed along one side or four sides of the circuit board 11.

Additionally, the lead 25 is bent, or formed into a so-called gull-wing shape in order to prevent a short circuit between the lead 25 and the side surface of the circuit board 11 from which the metal is exposed. In other words, a portion in the middle of the lead 25 is inclined upward, the portion being an inner region of the lead 25 relative to the outer peripheral edge of the circuit board 11. Thus, the lead 25 is separated from the side surface of the circuit board 11, and accordingly the short circuit therebetween is prevented.

In this embodiment, the land portion 18 is formed in the part of the lead 25A, and the back surface of the land portion 18 is attached to the top surface of the insulating layer 12. Furthermore, the top surface of the land portion 18 is mounted with the above-described power element 15B. This makes it possible to suitably dissipate heat generated from the power element 15B to the outside, through the land portion 18, the insulating layer 12, and the circuit board 11, because the land portion 18 serves as a heat sink.

The land portion 18 is formed of the part of the lead 25A, and the bottom surface of the land portion 18 is attached to the top surface of the circuit board 11. Thereby, the lead 25A is fixed to the circuit board 11. Here, the width of the part of the lead 25A is formed wide, and thus the land portion 18 is formed. The planar size of the land portion 18 is formed larger than that of the power element 15B, which is mounted on the top surface of the land portion 18.

The lead 25A is formed by etching or pressing a metal plate having a thickness of approximately 0.5 mm. Thus, the lead 25A is formed thick in comparison with the conductive pattern 13 formed on the top surface of the circuit board 11. For this reason, the land portion 18 formed of the part of the lead 25A is also formed thick, and serves as a heat sink, thereby contributing to the dissipation of heat generated from the power element 15B.

The power element 15B is fixed to the top surface of the land portion 18 in the lead 25A with a conductive joint member 16A such as a solder. Thus, an electrode on the back surface of the power element 15B is directly connected to the lead 25A without the conductive pattern 13 on the circuit board 11. Thereby, it is not necessary to form the conductive pattern 13 having a large width on the surface of the circuit board 11 in order to secure a large current capacity, and therefore it is possible to miniaturize the circuit board 11. Additionally, the cross section of the lead 25A is as large as, for example, approximately 0.5 mm in length and 0.5 mm in width, and it is possible to sufficiently secure the current capacity.

An electrode formed on the top surface of the power element 15B is connected to the pad 13A on the circuit board 11 with the thin metal wire 17. When the current capacity is in need, a thick wire having a diameter of approximately 150 μm or larger is used as the thin metal wire 17.

Next, with reference to FIGS. 2A and 2B, description will be given of a structure in which the power element 15B is connected. FIGS. 2A and 2B are cross-sectional views showing a structure in which the power element 15B is fixed.

As shown in FIG. 2A, the land portion 18 in the lead 25A is fixed directly to the insulating layer 12 which covers the top surface of the circuit board 11. In this case, the land portion 18 is attached to the top surface of the insulating layer 12 in a B stage, and then the insulating layer 12 is heated and hardened. Thereby, the back surface of the land portion 18 is fixed to the circuit board 11. By employing this structure, it is possible to efficiently dissipate heat generated from the power element 15B to the outside, because only the insulating layer 12 exists between the land portion 18 and the circuit board 11.

In FIG. 2B, the back surface of the land portion 18 is fixed to the land-shaped conductive pattern 13 formed on the top surface of the insulating layer 12 with a joint member 16B such as a solder.

In this case, it is preferable to employ the joint member 16A used for mounting the power element 15B and the joint member 16B used for mounting the land portion 18, whose melting points are different from each other.

Specifically, in the case where the back surface of the land portion 18 is mounted on the circuit board 11 after the power element 15B is fixed to the top surface of the land portion 18, it is preferable that the temperature at which the joint member 16A melts should be set to be higher than the temperature at which the joint member 16B melts. Thereby, the joint member 16A can be prevented from melting in the step of mounting the land portion 18, on which the power element 15 has been fixed with the joint member 16A, on the circuit board 11 by using the melted joint member 16B.

Meanwhile, in the case where the power element 15B is mounted on the land portion 18 after the land portion 18 is fixed to the circuit board 11, it is preferable that the temperature at which the joint member 16B melts should be set to be higher than the temperature at which the joint member 16A melts. Thereby, the joint member 16B, which is used for fixing the land portion 18, can be prevented from melting, in the step of mounting the power element 15B on the top surface of the land portion 18, by using the melted joint member 16A.

Figure 3A:
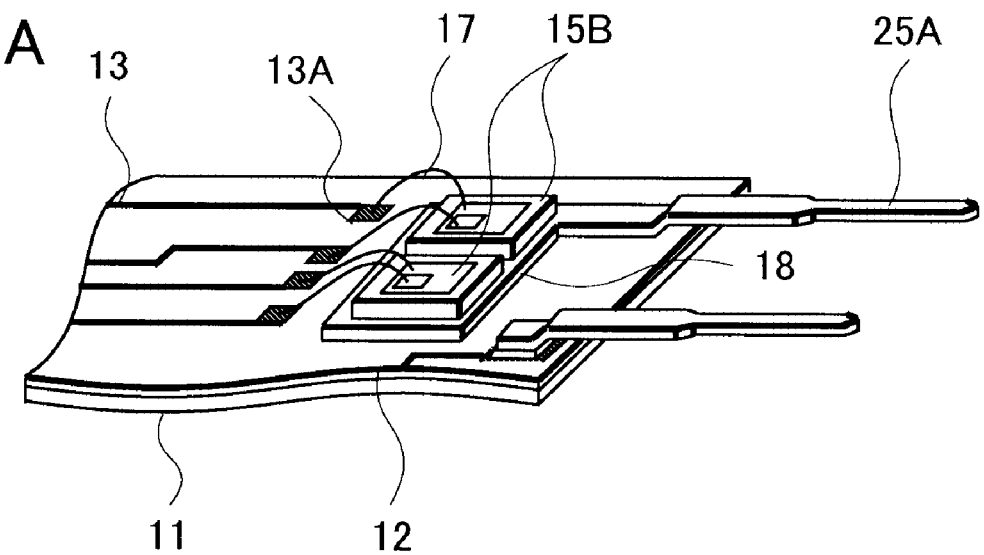
FIG. 3A is a perspective view of the circuit device according to the present invention.
Figure 3B:
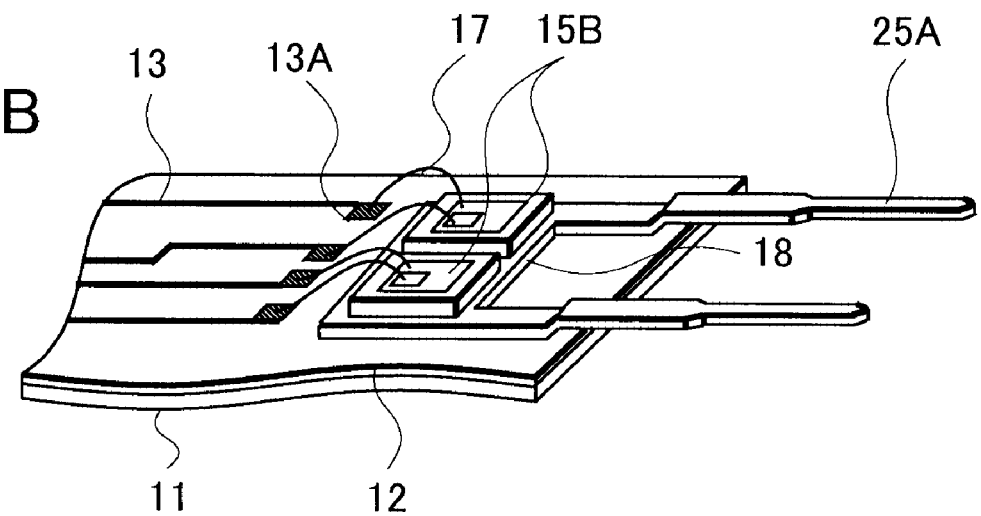
FIG. 3B is a perspective view of the circuit device according to the present invention.

Next, description of the lead 25A will be given more specifically with reference to FIGS. 3A and 3B. In the above description, the single power element 15B is fixed to the land portion 18 formed in the lead 25A. However, it is possible to mount the multiple (2 in this case) power elements 15B on the top surface of the single land portion 18 as shown in FIG. 3A. Meanwhile, it is possible to provide the multiple leads 25A for the single land portion 18 as shown in FIG. 3B.

Second Embodiment

In this embodiment, description will be given of a fundamental method of fabricating a hybrid integrated circuit device with reference to FIGS. 4A to 4E.

Figure 4A:
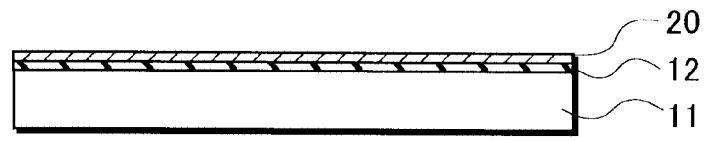
FIG. 4A is a cross-sectional view for explaining a method of fabricating a circuit device according to the present invention.

As shown in FIG. 4A, firstly, a conductive foil 20 is attached on the entire top surface of a circuit board 11 with an insulating layer 12 interposed therebetween. The circuit board 11 is made of a metal such as copper or aluminium as the main material, and it is possible to adopt, for example, an aluminium board having a thickness of approximately 1.5 mm, and having both main surfaces subjected to anodic oxidation. Alternatively, it is possible to adopt a conductive foil made of copper as the main material, and having a thickness of, for example, approximately 50 μm to 100 μm, as the conductive foil 20.

The insulating layer 12 is made of, for example, an epoxy resin in which a filler such as $Al_2O_3$ is filled to a high degree, and functions as an adhesive for adhering the circuit board 11 and the conductive foil 20. Furthermore, the insulating layer 12 also functions to insulate the circuit board 11 from the conductive foil 20. In this step, the insulating layer 12 may be in a C state where the insulating layer 12 is completely hardened, or may be in a B stage where the insulating layer 12 is half hardened. To bring the insulating layer 12 into the C stage, the insulating layer 12 is heated to approximately 200 degrees. To bring the insulating layer 12 into the B stage, the insulating layer 12 is heated to approximately 100 degrees. The insulating layer 12 in the B stage has an adhesive force. Accordingly, by bringing the insulating layer 12 into the B stage, the back surface of a land portion 18 of a lead 25A can be attached on the top surface of the insulating layer 12 in the subsequent step. Meanwhile, the insulating layer 12 may be in the C stage, when the land portion 18 in the lead 25A is fixed to a conductive pattern 13 in the subsequent step as shown in FIG. 2B.

Figure 4B:
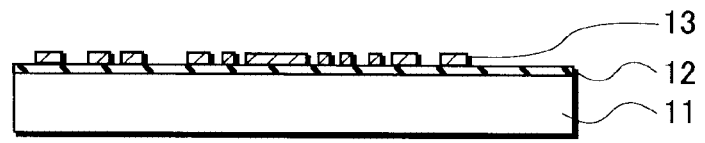
FIG. 4B is a cross-sectional view for explaining the method of fabricating a circuit device according to the present invention.

Next, the conductive pattern 13 is formed by patterning the conductive foil 20 as shown in FIG. 4B. The conductive pattern 13 is formed by wet-etching with an unillustrated etching resist. In this step, the conductive foil 20 is etched to expose a region of the insulating layer 12, to which the lead 25A is fixed in the subsequent step.

Figure 4C:
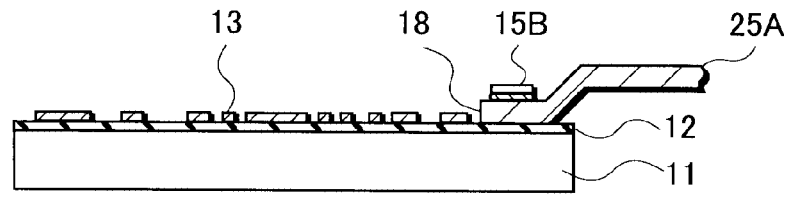
FIG. 4C is a cross-sectional view for explaining the method of fabricating a circuit device according to the present invention.

Subsequently, the back surface of the land portion 18 in the lead 25A is attached to the top surface of the insulating layer 12 in the B stage as shown in FIG. 4C. As described above, the surface of the insulating layer 12 in the B state (half-hardened state) has an adhesive force. Thus, by attaching the land portion 18 formed in the part of the lead 25A to the top surface of the insulating layer 12, it is possible to fix the lead 25A to the circuit board 11. After the lead 25A is fixed, the insulating layer 12 is brought into the C stage (complete-hardened state) by heating the insulating layer 12 to approximately 200 degrees. As illustrated, a power element 15B may be mounted on the top surface of the land portion 18 in advance.

Figure 4D:
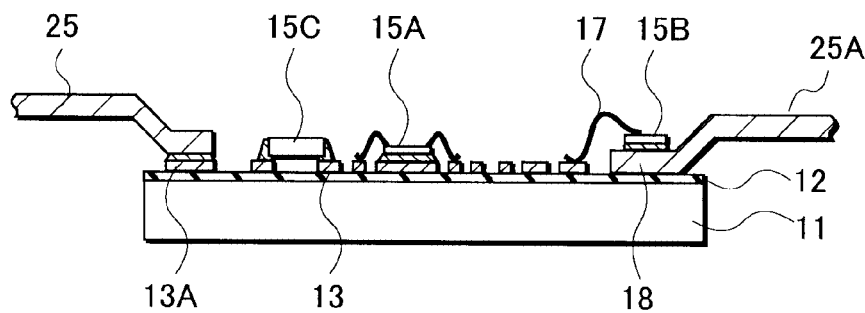
FIG. 4D is a cross-sectional view for explaining the method of fabricating a circuit device according to the present invention.

Thereafter, a circuit element is electrically connected to the conductive pattern 13 on the circuit board 11 as shown in FIG. 4D. Semiconductor elements such as a control element 15A and a chip element 15C are fixed to the conductive pattern 13. Furthermore, the lead 25 is fixed to a pad 13A formed of the land-shaped conductive pattern 13. An electrode on the surface of the control element 15A is connected to the conductive pattern 13 with a thin metal wire 17. Additionally, the power element 15B fixed to the top surface of the land portion 18 is also connected to the conductive pattern 13 on the circuit board 11 with the thin metal wire 17

Figure 4E:
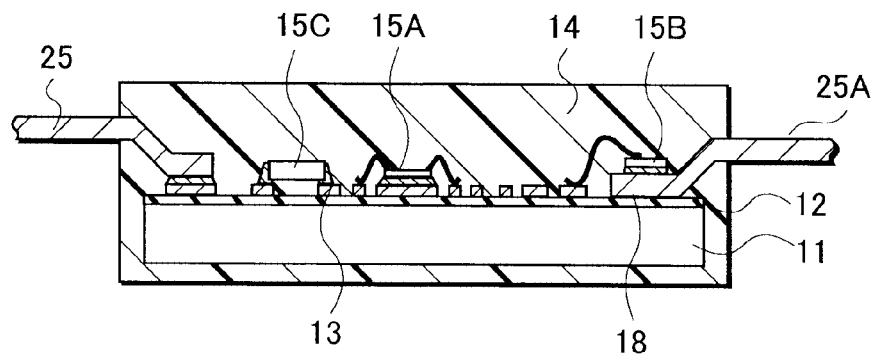
FIG. 4E is a cross-sectional view for explaining the method of fabricating a circuit device according to the present invention.

After that, a sealing resin 14 is formed to seal at least the top surface of the circuit board 11 as shown in FIG. 4E. The entire surface of the circuit board 11 is sealed by transfer molding with a thermosetting resin. When the circuit board 11 is sealed, injection molding, potting, or a case material may be employed for sealing.

Third Embodiment

In this embodiment, with reference to FIGS. 5A to 7B, description will be given of a method of fabricating a hybrid integrated circuit device using a lead frame 40.

Figure 5A:
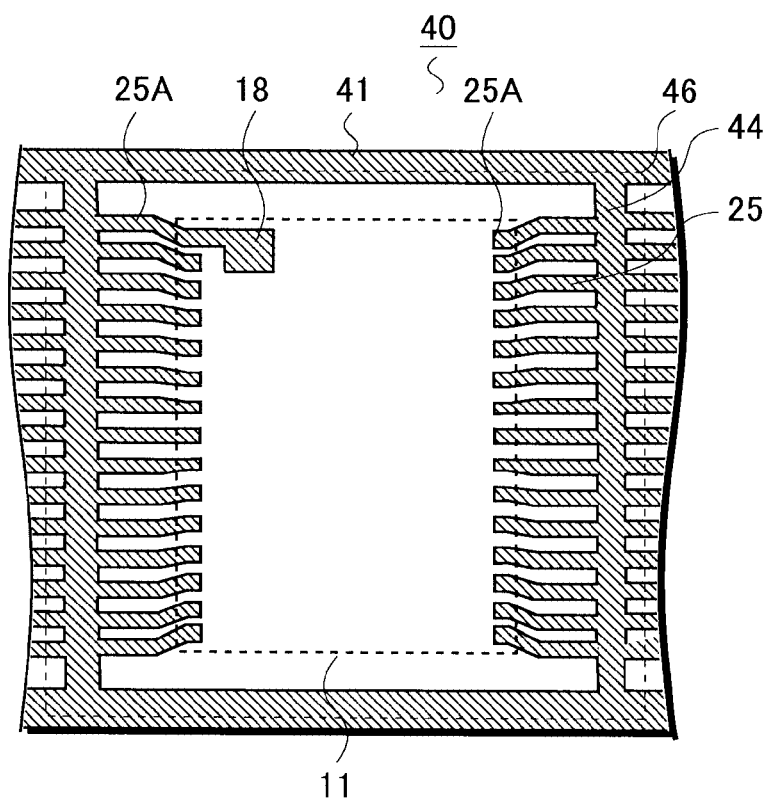
FIG. 5A is a plan view for explaining a method of fabricating a circuit device according to the present invention.
Figure 5B:
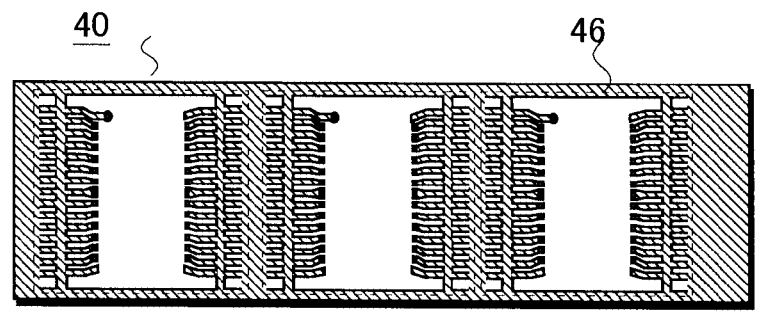
FIG. 5B is a plan view for explaining the method of fabricating a circuit device according to the present invention.
Figure 5C:
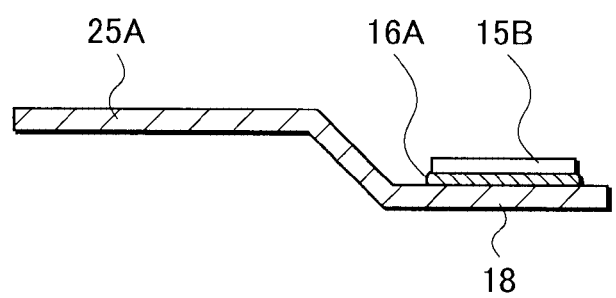
FIG. 5C is a cross-sectional view for explaining the method of fabricating a circuit device according to the present invention.

As shown in FIGS. 5A to 5C, firstly, there is prepared the lead frame 40 provided with multiple leads 25. FIG. 5A is a plan view showing a single unit 46 provided to the lead frame 40. FIG. 5B is a plan view showing the entire lead frame 40. FIG. 5C is a cross-sectional view showing a land portion 18 formed in a lead 25A. In FIG. 5A, a dotted line indicates a region where a circuit board 11 is mounted in a step described later.

As shown in FIG. 5A, the unit 46 is formed of the multiple leads 25 whose one ends are positioned in the region where the circuit board 11 is mounted. The leads 25 extend in both right and left directions of the drawing toward the region where the circuit board 11 is mounted. The multiple leads 25 are connected to each other with tie-bars 44 elongated from outer rails 41. By this structure, the deformation of the leads 25 is prevented. Moreover, the tip end of the lead 25A is formed into the partially-widened land portion 18.

As shown in FIG. 5B, the multiple units 46 with the above-described configuration are disposed on the stripe-shaped lead frame 40, while separated from each other. In this embodiment, the multiple units 46 are provided to the lead frame 40 to conduct steps such as wire-bonding and molding at once in fabricating a hybrid integrated circuit device. Thereby, the productivity is improved.

As shown in FIG. 5C, a power element 15B is fixed to the land portion 18 in the lead 25A before the lead frame 40 is fixed to the circuit board 11. Here, the back surface of the power element 15B is fixed to the top surface of the land portion 18 with a joint member 16A made of a solder or a conductive paste interposed therebetween.

Figure 6A:
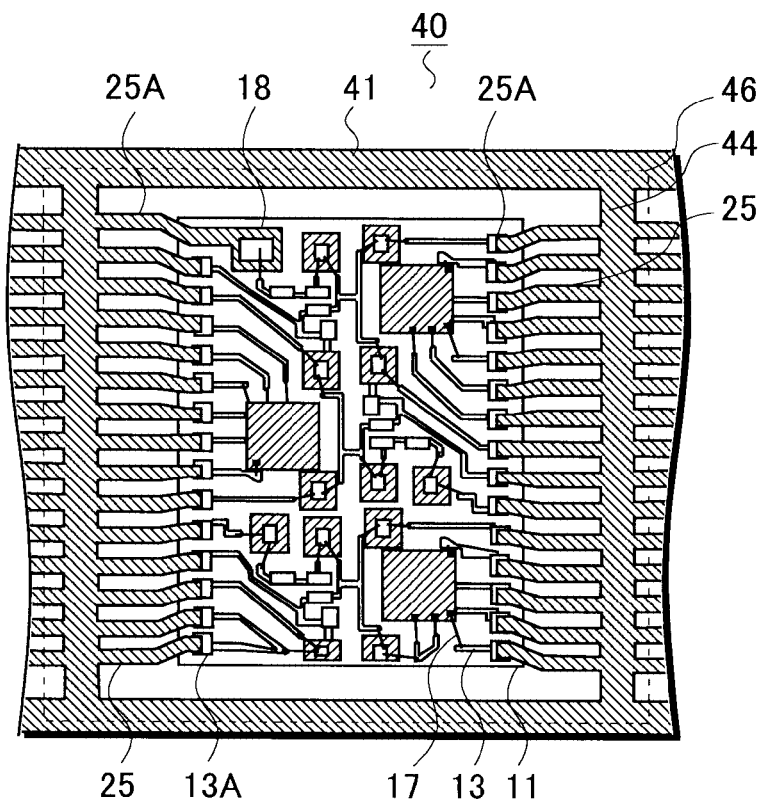
FIG. 6A is a plan view for explaining the method of fabricating a circuit device according to the present invention.
Figure 6B:
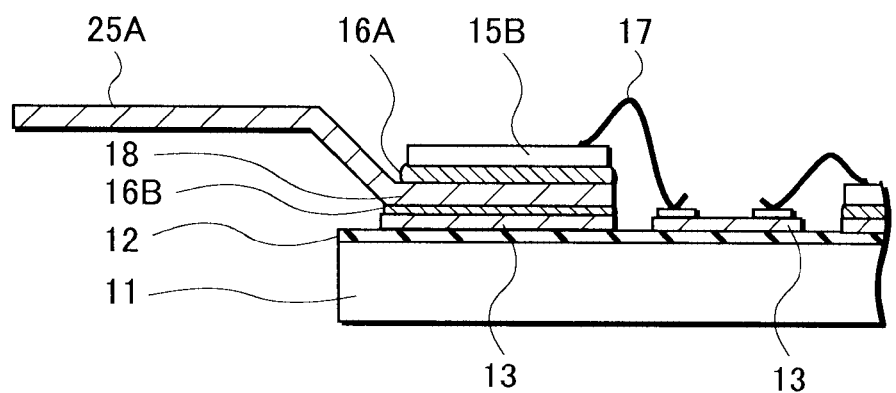
FIG. 6B is a cross-sectional view for explaining the method of fabricating a circuit device according to the present invention.
Figure 6C:
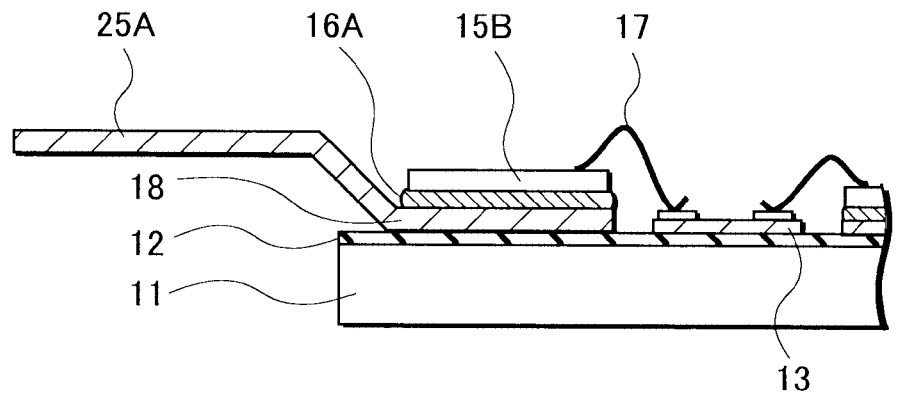
FIG. 6C is a cross-sectional view for explaining the method of fabricating a circuit device according to the present invention.

Subsequently, the circuit board 11 is fixed to the lead frame 40 as shown in FIGS. 6A and 6C. FIG. 6A is a plan view showing the unit 46 of the lead frame 40. FIGS. 6B and 6C are cross-sectional views showing the position where the power element 15B is fixed to the land portion 18.

As shown in FIG. 6A, the circuit board 11 is fixed to the lead frame 40 by fixing the leads 25 to pads 13A formed on the periphery of the circuit board 11. The tip end of the lead 25 is fixed to the pad 13A on the circuit board 11 with a joint member such as a solder. Moreover, in this step, the land portion 18 in the lead 25A is fixed to a left-upper portion of the circuit board 11 in the drawing. The back surface of the land portion 18 may be fixed to a conductive pattern 13 which is formed on the top surface of the circuit board 11, or may be attached to an insulating layer 12 which covers the top surface of the circuit board 11.

Furthermore, a circuit element such as a semiconductor element is mounted on the circuit board 11. The circuit board 11 having the circuit element previously mounted thereon may be fixed to the lead frame 40. Alternatively, after the circuit board 11 is fixed to the lead frame 40, the circuit element may be mounted on this circuit board 11. Subsequently, the circuit element thus mounted is connected to the conductive pattern 13 with a thin metal wire 17.

As shown in FIG. 6B, the back surface of the land portion 18 formed at the tip end of the lead 25A is fixed to the land-shaped conductive pattern 13 with a joint member 16B such as a solder interposed therebetween. Moreover, the power element 15B such as a power MOS is fixed to the top surface of the land portion 18 with the joint member 16A interposed therebetween. An electrode formed on the top surface of the power element 15B is connected to the conductive pattern 13 with the thin metal wire 17.

As described above, it is preferable that the joint member 16A, which is used for mounting the power element 15B, and the joint member 16B, which is used for mounting the land portion 18, should have melting points different from each other.

Specifically, it is preferable that the temperature at which the joint member 16A melts should be set to be higher than the temperature at which the joint member 16B melts, in the case where the back surface of the land portion 18 is mounted on the circuit board 11 after the power element 15B is fixed to the top surface of the land portion 18. Meanwhile, it is preferable that the temperature at which the joint member 16B melts should be set to be higher than the temperature at which the joint member 16A melts, in the case where the power element 15B is mounted on the land portion 18 after the land portion 18 is fixed to the circuit board 11.

As shown in FIG. 6C, the back surface of the land portion 18 is attached to the top surface of the insulating layer 12 in a B stage. The insulating layer 12 in the B stage is a semi-solid, and has a strong adhesiveness, and thus the insulating layer 12 can be used as an adhesive to fix the back surface of the land portion 18 to the circuit board 11. In this case, after the land portion 18 is attached to the insulating layer 12, a heat treatment for hardening the insulating layer 12 is conducted.

Figure 7A:
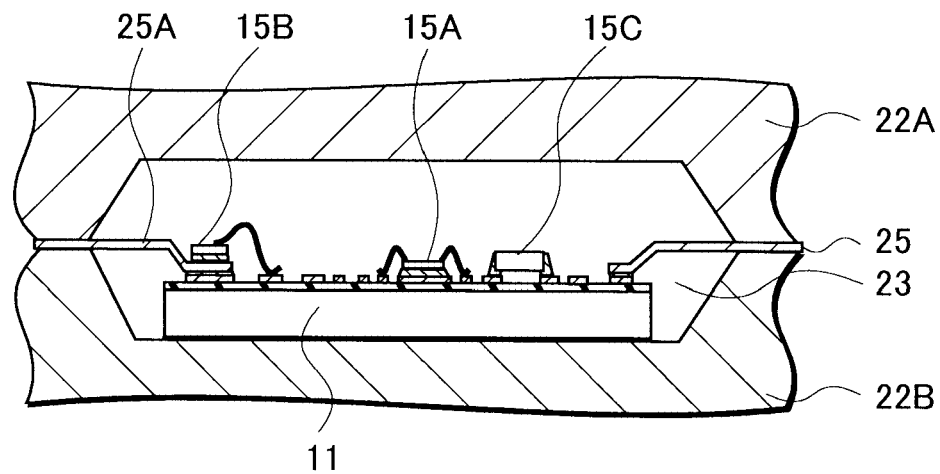
FIG. 7A is a cross-sectional view for explaining the method of fabricating a circuit device according to the present invention.
Figure 7B:
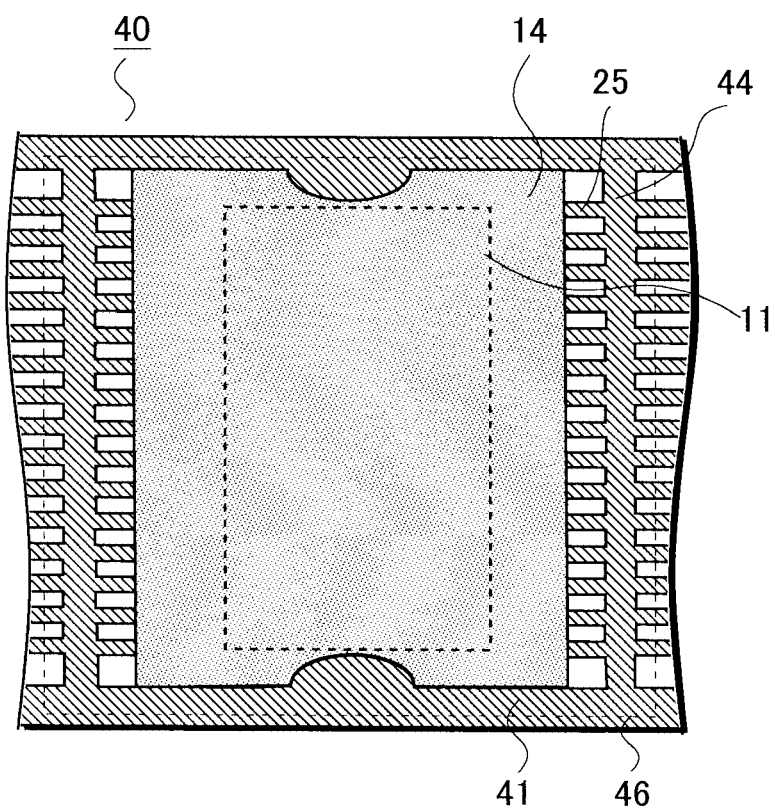
FIG. 7B is a plan view for explaining the method of fabricating a circuit device according to the present invention.

Thereafter, a sealing resin 14 is formed to cover the circuit board 11 as shown in FIGS. 7A and 7B. FIG. 7A is a cross-sectional view showing a step of molding the circuit board 11 with a die. FIG. 7B is a plan view showing the lead frame 40 after the molding.

As shown in FIG. 7A, firstly, the circuit board 11 is accommodated in a cavity 23 formed by an upper die 22A and a lower die 22B. By causing the leads 25 to abut the upper die 22A and the lower die 22B, the position of the circuit board 11 is fixed inside the cavity 23. Then, the circuit board 11 is sealed by injecting a resin in the cavity 23 from an unillustrated gate provided in the mold. In this step, the circuit board 11 is sealed by transfer molding with a thermosetting resin or by injection molding with a thermoplastic resin.

After the molding step described above is completed, the leads 25 are separated from the lead frame 40 as shown in FIG. 7B. Specifically, the leads 25 are separated individually at positions on the tie-bars 44, and a hybrid integrated circuit device as shown in FIG. 1 is separated from the lead frame 40.

Fourth Embodiment

Figure 8A:
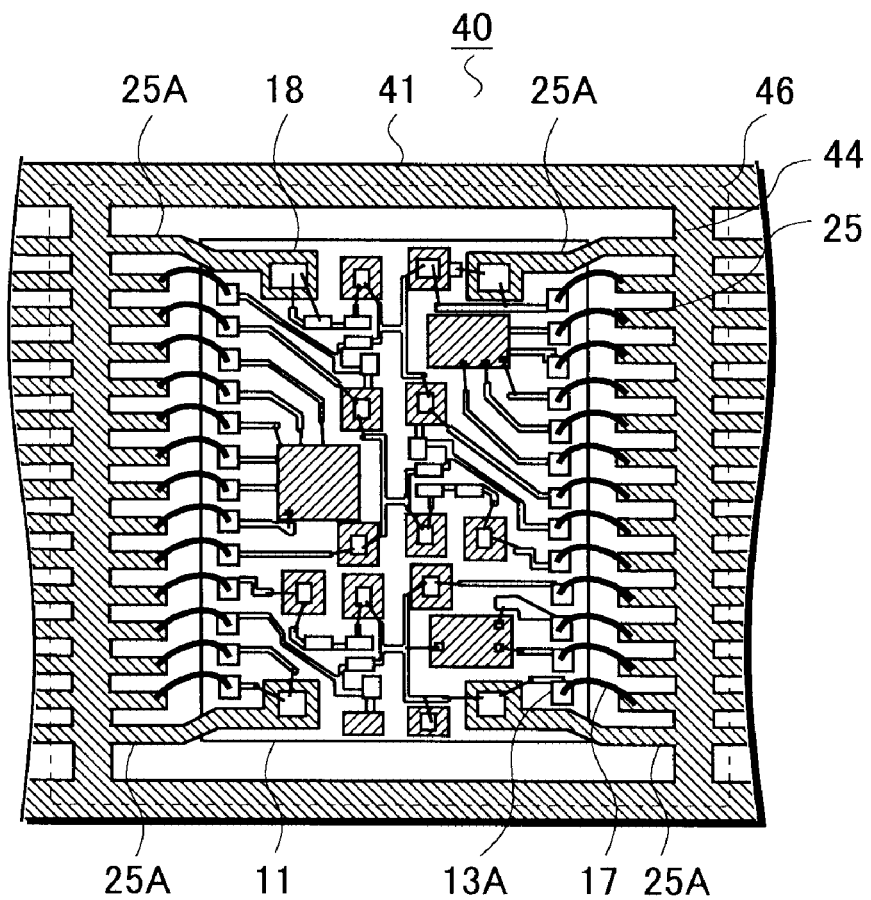
FIG. 8A is a plan view for explaining a method of fabricating a circuit device according to the present invention.
Figure 8B:
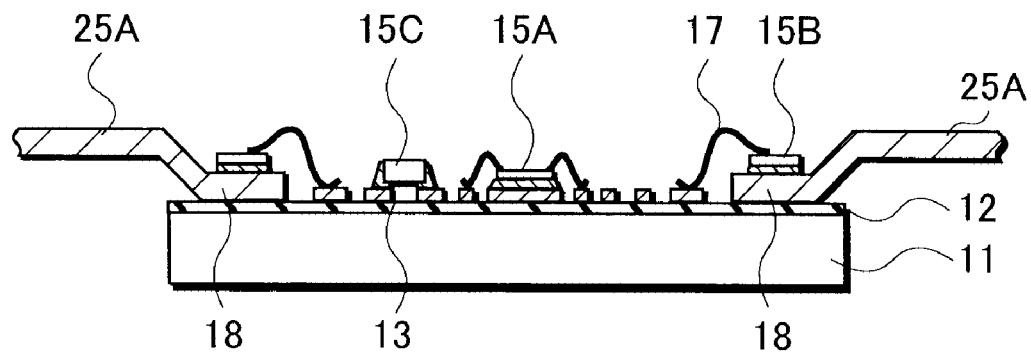
FIG. 8B is a cross-sectional view for explaining the method of fabricating a circuit device according to the present invention.
Figure 9:
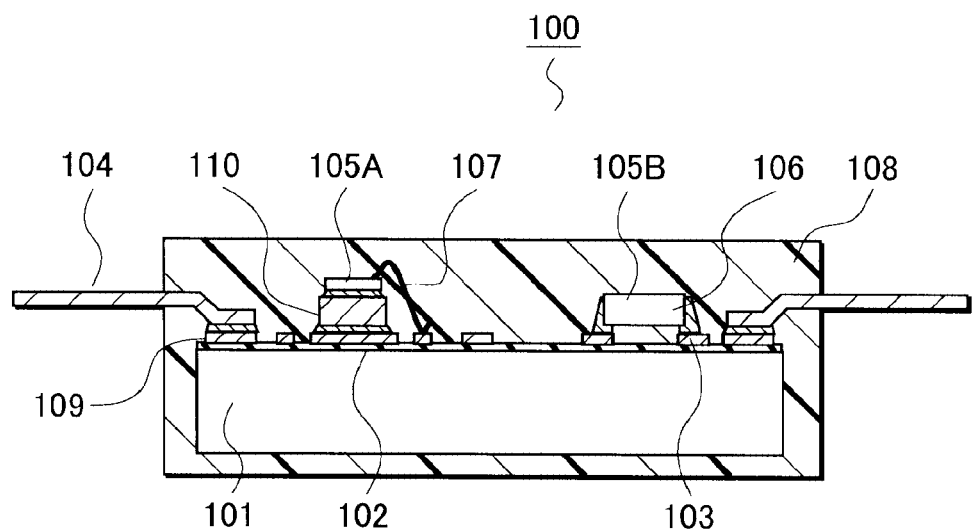
FIG. 9 is a cross-sectional view for explaining a conventional hybrid integrated circuit device.

With reference to FIGS. 8A to 8B, description will be given of another structure in which a circuit board 11 is fixed to a lead frame 40. FIG. 8A is a plan view of a unit 46 of the lead frame 40. FIG. 8B is a cross-sectional view showing a position where a land portion 18 is formed.

As shown in FIGS. 8A and 8B, leads 25A having the land portions 18 formed at the tip ends are disposed on four corners of the circuit board 11. The back surfaces of the land portions 18 are attached to an insulating layer 12 in a B stage. Thereby, the circuit board 11 is fixed to the lead frame 40 with the leads 25A having the land portions 18. In this respect, it is not always necessary to dispose the four leads 25 to support the circuit board 11. At least two of the leads 25A will suffice to support the circuit board 11.

As described above, by supporting the circuit board 11 with the leads 25A disposed on the four corners of the circuit board 11, other leads 25 do not need to have a function to mechanically support the circuit board 11. Thus, the pads 13A and the leads 25 formed on the periphery of the circuit board 11 can be connected to each other with thin metal wires 17. By this connection with the thin metal wires 17, a large number of pads 13A can be formed along sides of the circuit board 11 in comparison with the case of fixing the leads 25 to the pads 13A as shown in FIG. 1. This is because each pad 13A can be miniaturized, while wire-bonding is still feasible.

In the circuit device according to the present invention, the circuit element is mounted on the top surface of the land portion formed of the part of the lead, and the back surface of the land portion is fixed to the circuit board. For this reason, the land portion functions as the heat sink as described above. Therefore, it is possible to fabricate a circuit device with no additional heat sink. Furthermore, since the circuit element is directly fixed to the land portion which is the part of the lead, a conductive pattern is no longer necessary in some part from the circuit element to the lead. This allows the structure of the circuit device to be simplified, and thereby the production cost is reduced.

Still furthermore, the back surface of the land portion fixed with the circuit element can be fixed to the circuit board by an adhesive force of the insulating layer in the B stage. Accordingly, it is possible to preferably dissipate heat generated from the circuit element mounted on the top surface of the land portion to the outside, because only the insulating layer exists between the land portion and the circuit board.

In the method of fabricating a circuit device according to the present invention, the step of mounting a heat sink on a circuit board is no longer necessary. Therefore, the number of fabrication steps is reduced, and thereby the production cost is reduced.

Furthermore, the land portion formed of the part of the lead is attached to the surface of the insulating layer in the B stage, which is formed on the top surface of the circuit board. The insulating layer is hardened with a heat treatment, and accordingly, the lead is fixed to the circuit board. Therefore, it is possible to fix the lead to the circuit board without a joint member such as a solder.

Still furthermore, according to the present invention, in fabricating a circuit device using the lead frame in which the multiple leads are connected to each other, the back surfaces of the lands formed of the parts of the leads are attached to the insulating layer which covers the surface of the circuit board. Thereby, it is possible to fix the circuit board to the lead frame.

What is claimed is:

1. A circuit device, comprising:
   a circuit board;
   a conductive pattern, which is formed on the top surface of the circuit board;
   circuit elements, which are electrically connected to the conductive pattern; and
   leads, which are electrically connected to the circuit elements, and which are led out to the outside,
   wherein a plurality of said circuit elements are mounted on the top surface of a land portion formed of a part of the lead, wherein a plurality of said leads are provided for said land portion, and wherein the bottom surface of the land portion is fixed to the conductive pattern.

2. The circuit device according to claim 1, wherein the land portion is fixed to the conductive pattern.

3. The circuit device according to claim 1, wherein the circuit elements mounted on the land portion are each electrically connected to the conductive pattern by being connected to the conductive pattern with a thin metal wire.

4. The circuit device according to claim 1, wherein the circuit element includes: a power element; and a control element which controls the power element, the control element is connected to the conductive pattern, and the power element is fixed to the land portion.

5. The circuit device according to claim 1, wherein an electrode on the back surface of the circuit elements is connected to the land portion without the conductive pattern needing a large width on the surface of the circuit board to secure a large current capacity, enabling miniaturization of the circuit board.

6. The circuit device according to claim 1, wherein said land portion and said plurality of leads comprise a single integral metal plate having a land portion and said plurality of leads.

7. The circuit device according to claim 1, wherein said metal plate is of sufficient thickness to operate as a heat sink and to dissipate heat generated from at least one of said plurality of circuit elements on said land portion.

8. The circuit device according to claim 1, wherein a planar size of the land portion is formed such as to be larger than that of said plurality of circuit elements on said land portion.

* * * * *